(12) United States Patent
Komatsu et al.

(10) Patent No.: US 10,097,159 B2
(45) Date of Patent: Oct. 9, 2018

(54) ACOUSTIC WAVE ELEMENTS, ANTENNA DUPLEXERS AND ELECTRONIC DEVICES

(71) Applicant: SKYWORKS FILTER SOLUTIONS JAPAN CO., LTD., Kadoma-Shi (JP)

(72) Inventors: Tomoya Komatsu, Osaka-Fu (JP); Hidehito Shimizu, Kadoma (JP); Joji Fujiwara, Osaka-Fu (JP); Tetsuya Tsurunari, Osaka-Fu (JP); Hiroyuki Nakamura, Osaka-Fu (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 232 days.

(21) Appl. No.: 15/067,304

(22) Filed: Mar. 11, 2016

(65) Prior Publication Data

US 2016/0268997 A1    Sep. 15, 2016

Related U.S. Application Data

(60) Provisional application No. 62/132,046, filed on Mar. 12, 2015.

(51) Int. Cl.
| | |
|---|---|
| H03H 9/02 | (2006.01) |
| H03H 9/25 | (2006.01) |
| H03H 9/64 | (2006.01) |
| H03H 9/72 | (2006.01) |

(52) U.S. Cl.
CPC .......... *H03H 9/25* (2013.01); *H03H 9/02559* (2013.01); *H03H 9/02834* (2013.01); *H03H 9/6496* (2013.01); *H03H 9/725* (2013.01)

(58) Field of Classification Search
CPC ... H03H 9/02559; H03H 9/05834; H03H 9/25
USPC ...... 310/313 R, 313 A, 313 B, 313 C, 313 D
See application file for complete search history.

(56) References Cited

U.S. PATENT DOCUMENTS

| | | | |
|---|---|---|---|
| 2002/0070822 A1* | 6/2002 | Kaneda ............... | H03H 9/6433 333/195 |
| 2004/0130239 A1 | 7/2004 | Kando et al. | |
| 2010/0072856 A1 | 3/2010 | Kadota et al. | |
| 2011/0037343 A1* | 2/2011 | Isobe .................. | H03H 9/0222 310/313 A |
| 2012/0044027 A1 | 2/2012 | Nakanishi et al. | |

(Continued)

OTHER PUBLICATIONS

Naumenko, Natalya, "Multilayered Structure as a Novel Material for Surface Acoustic Wave Devices: Physical Insight", Acoustic Waves—From Microdevices to Helioseismology, Nov. 14, 2011, pp. 421-442.

(Continued)

*Primary Examiner* — Derek Rosenau
(74) *Attorney, Agent, or Firm* — Lando & Anastasi, LLP

(57) ABSTRACT

An acoustic wave element comprising a lithium tantalate substrate having the Euler angles ($\varphi$, $\theta$, $\psi$), a first component $\varphi$ satisfying $10° \leq \varphi \leq 50°$; and an electrode disposed on the lithium tantalate substrate and configured to excite a main acoustic wave of wavelength $\lambda$, the electrode having a density $\rho M$ satisfying $\rho M \geq \rho Ti$ where $\rho Ti$ represents a density of titanium (Ti), and a thickness hM of the electrode satisfies $0.141 \times \exp(0.075 \rho M)\lambda \leq hM \leq 0.134\lambda$. Embodiments of the present disclosure minimize a thickness of the electrode and suppress a spurious Rayleigh wave signal.

20 Claims, 14 Drawing Sheets

(56) References Cited

U.S. PATENT DOCUMENTS

| | | | |
|---|---|---|---|
| 2013/0026881 A1* | 1/2013 | Okamoto | H03H 9/0222 |
| | | | 310/313 C |
| 2013/0049533 A1* | 2/2013 | Matsuda | H03H 9/02834 |
| | | | 310/313 C |
| 2014/0225684 A1* | 8/2014 | Kando | H03H 9/02559 |
| | | | 333/195 |

OTHER PUBLICATIONS

Partial European Search Report from corresponding European Application No. 16159654.9 dated Jul. 20, 2016.

* cited by examiner $h_T = 0$ $h_T = h_M$

ACOUSTIC WAVE ELEMENTS, ANTENNA DUPLEXERS AND ELECTRONIC DEVICES

CROSS-REFERENCE TO RELATED APPLICATIONS

This application claims priority under 35 U.S.C. § 119(e) to U.S. Provisional Patent Application Ser. No. 62/132,046, titled "ACOUSTIC WAVE ELEMENTS, ANTENNA DUPLEXERS AND ELECTRONIC DEVICES," filed on Mar. 12, 2015, which is hereby incorporated herein by reference in its entirety.

TECHNICAL FIELD

Aspects and embodiments of the present disclosure generally relate to an acoustic wave element, an antenna duplexer or a diplexer including the acoustic wave element, and an electronic device including the acoustic wave element, the antenna duplexer, or the diplexer.

BACKGROUND

Conventionally, an acoustic wave element in which non-leaky shear horizontal (SH) waves propagate along a lithium tantalate (LiTaO$_3$) substrate has been used as a filter and an antenna duplexer for a mobile communication device and the like. In such an acoustic wave element, the SH waves are excited by configuring the velocities of the SH waves to be less than those of the slow shear waves (SSW); see for example, US 2007/0090898(A1).

SUMMARY OF THE INVENTION

However, the acoustic wave element in which the non-leaky SH waves propagate along the lithium tantalate substrate requires an increased thickness of an interdigitated transducer (IDT) electrode. Specifically, the thickness of the IDT electrode is more than double that of an IDT electrode of an acoustic wave element that allows leaky SH waves to propagate. For example, when molybdenum (Mo) is used for the material of an IDT electrode, the ratio $h_M/\lambda$ of the thickness $h_M$ of the IDT electrode to the wavelength $\lambda$ of the SH wave may amount to greater than 9.5%. Such an increased thickness of the IDT electrode would lead to processing limitations in lithography and other processes and cause difficulties in manufacturing. Further, a cut angle for the rotational Y axis of lithium tantalate should be suppressed to less than common 42° in order to ensure a certain electromechanical coupling coefficient $k^2$. Such a smaller cut angle would cause a spurious signal due to a Rayleigh wave.

In view of the aforementioned circumstances, embodiments of the present disclosure provide an acoustic wave element in which non-leaky SH waves propagate along a lithium tantalate substrate, but the thickness of an IDT electrode can be minimized and a spurious Rayleigh wave signal may be suppressed, as well as an antenna duplexer or a diplexer, and an electronic device using the acoustic wave element, the antenna duplexer, or the diplexer.

In accordance with an embodiment of the present disclosure, the acoustic wave element comprises a lithium tantalate substrate having Euler angles ($\varphi$, $\theta$, $\psi$), the first component $\varphi$ satisfying $10° \leq \varphi \leq =°$; and an electrode disposed on the lithium tantalate substrate and configured to excite a main acoustic wave having a wavelength $\lambda$, the electrode having a density $\rho_M$ satisfying $\rho_M \geq \rho_{Ti}$ represents a density of titanium and having a thickness $h_M$ satisfying $0.141 \times \exp(-0.075 \rho_M) \lambda \leq h_M \leq 0.134 \lambda$.

In one embodiment, angle $\theta$ may satisfy $-90° - 0.5 \times (-0.2234 \rho_M^2 + 6.9119 \rho_M - 8.928)° \leq \theta \leq -90° + 0.5 \times (-0.2234 \rho_M^2 + 6.9119 \rho_M - 8.928)°$. Angle $\psi$ may satisfy $-16° \leq \psi \leq -2.5°$.

In accordance with embodiments of the present disclosure, the lithium tantalate substrate and the electrode may be covered thereabove with an insulation layer having a temperature coefficient opposite to that of the lithium tantalate substrate. The insulation layer may consist of silicon dioxide. A thickness $h_S$ of the insulation layer may satisfy $0.08\lambda \leq h_S \leq 0.55\lambda$.

In accordance with some embodiments, the insulation layer may have a protrusion thereabove in a cross section taken along a direction perpendicular to an extending direction of electrode fingers of the electrode. A height $h_T$ of the protrusion in the insulation layer may also satisfy $0 \leq h_T \leq h_M$, where $h_M$ is a thickness of the electrode. In accordance with some embodiments, angle $\psi$ may satisfy $(-371.81 h_S^2 + 36.92 h_S + 3.53)° \leq \psi \leq (-371.81 h_S^2 + 36.92 h_S + 13.53)°$.

An antenna duplexer according to embodiments of the present disclosure includes a reception filter and a transmission filter, at least one of which includes the acoustic wave element. A first frequency and a second frequency may pass respectively through the reception filter and the transmission filter. A diplexer according to embodiments of the present disclosure includes a first reception filter and a second reception filter, at least one of which includes the acoustic wave element. The first reception first reception filter can be configured to receive a first frequency band and the second reception filter may be configured to a second frequency band that is different than the first frequency band. An electronic device according to embodiments of the present disclosure includes the acoustic wave element, a semiconductor element connected to the acoustic wave element, and a reproduction device connected to the semiconductor element.

According to embodiments of the present disclosure, it is possible to minimize a thickness of an IDT electrode and also to suppress a spurious Rayleigh wave signal. Further, it is possible to improve the frequency characteristic and to downsize the device.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF DRAWINGS

Various aspects of at least one embodiment are discussed below with reference to the accompanying FIGURES, which are not intended to be drawn to scale. The FIGURES are included to provide illustration and a further understanding of the various aspects and embodiments, and are incorporated in and constitute a part of this specification, but are not intended as a definition of the limits of the invention. In the FIGURES, each identical or nearly identical component

DETAILED DESCRIPTION

Aspects and embodiments of acoustic wave elements are described below with reference to the accompanying drawings. It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 1A:
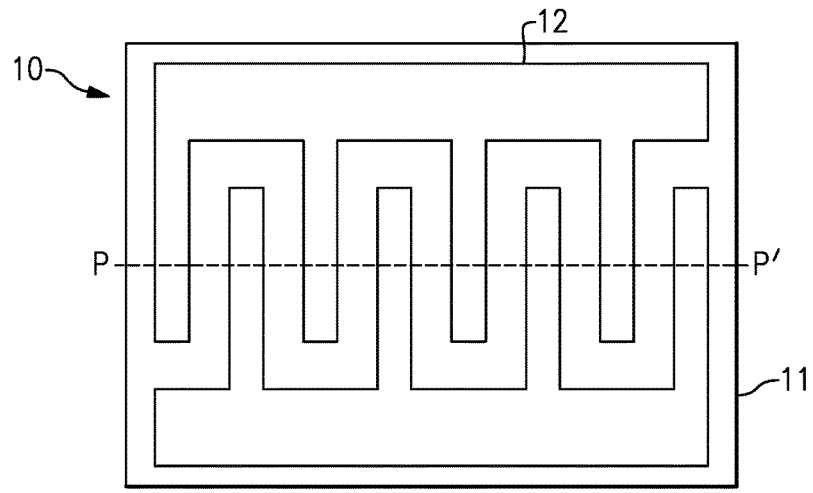
FIGS. 1A and 1B show a schematic structure of an acoustic wave element according to an embodiment of the present disclosure.
Figure 1B:
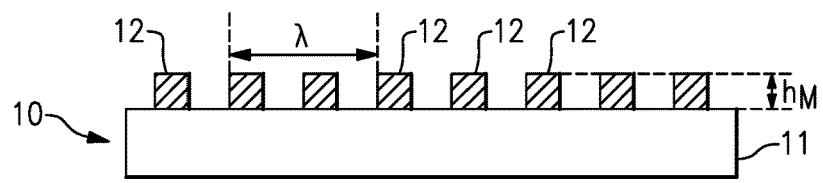

FIGS. 1A and 1B generally show a schematic structure of an acoustic wave element 10 according to an embodiment of the present disclosure. FIG. 1A shows a top view of the acoustic wave element 10, and FIG. 1B shows a cross-sectional view of the acoustic wave element 10 taken along line PP' in FIG. 1A.

The acoustic wave element 10 includes a substrate 11 fabricated by cutting a single crystal of lithium tantalate ($LiTaO_3$) along a plane defined by the Euler angles (ψ, θ, φ). A non-leaky SH wave may propagate on the cut surface of the substrate 11 as a main acoustic wave. The surface of the substrate 11 is provided with interdigitated transducer (IDT) electrodes 12 thereon. Each of the IDT electrodes 12 includes electrode fingers made of a certain metal material and extending in a certain direction for exciting a shear horizontal (SH) wave having a wavelength λ.

The embodiment illustrated in FIGS. 1A and 1B uses a metal material for the IDT electrodes 12 having a density of metal $ρ_M$ greater than the density of titanium $ρ_{Ti}$. Therefore, the density of metal $ρ_M$ of the IDT electrodes 12 may be defined by the following equation (1) with respect to the density of titanium $ρ_{Ti}$:

$$ρ_M ≥ ρ_{Ti} \qquad (1)$$

The IDT electrodes 12 being made of a metal having a density that is greater than or equal to the density of titanium $ρ_{Ti}$ enables one to reduce a thickness $h_M$ thereof. Therefore, the IDT electrodes 12 may be formed by lithography and other processes.

In accordance with the embodiment illustrated in FIGS. 1A and 1B, the thickness $h_M$ of the IDT electrodes 12 may be defined by the following equation (2) with respect to the wavelength λ of an ST wave excited by the IDT electrodes 12:

$$0.141 \times \exp(-0.075\rho_M)\lambda \leq h_M \leq 0.134\lambda \quad (2)$$

If the thickness $h_M$ of the IDT electrodes 12 is normalized by the wavelength λ of an SH wave, then a normalized thickness h would be introduced as the following equation (3):

$$h = h_M/\lambda \quad (3)$$

Using the normalized thickness h, the aforementioned equation (2) would be expressed as the following equation (4):

$$0.141 \times \exp(-0.075\rho_M) \leq h \leq 0.134 \quad (4)$$

Equation (4) is obtained as follows.

The embodiment illustrated in FIGS. 1A and 1B may set the upper limit as defined in equation (4), i.e., h≤0.134, to the normalized thickness h. The upper limit setting may ensure the processing of the IDT electrodes 12 to be formed. Therefore, processing defects such as insufficient etching would be prevented in the forming processes.

Figure 2:
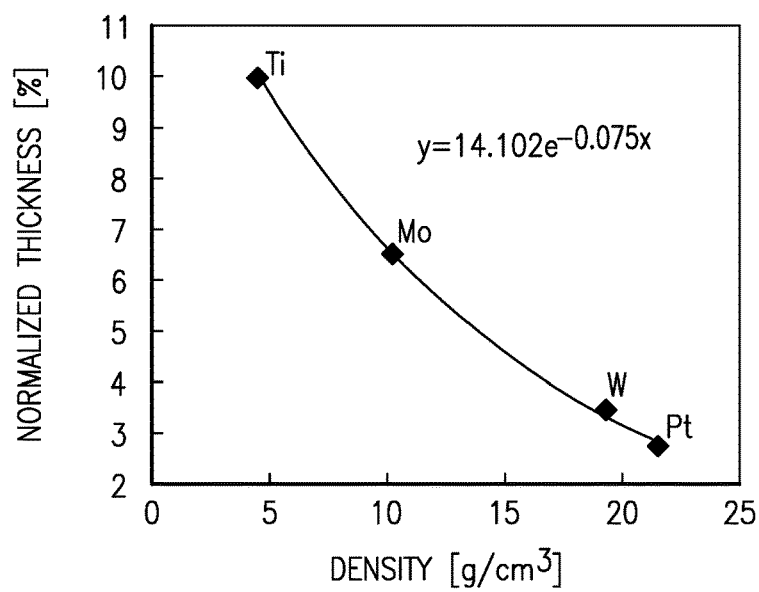
FIG. 2 is a graph showing a relationship between a lower limit of a normalized thickness and a density of an IDT electrode.

FIG. 2 is a graph showing a relationship between a lower limit of a normalized thickness h of the IDT electrodes 12 required to excite an SH wave and a density of metal $\rho_M$ constituting the IDT electrodes 12 for respective metal materials. Here, because the slow shear wave (SSW) propagates fastest, the thickness of the IDT electrode 12 would be least when an upper limit of the velocity of the shear horizontal (SH) wave to be excited is maximized In order to realize the aforementioned least thickness, an excitation condition for the SH wave can be obtained where angle θ of the second component of the Euler angles is −90° and angle φ of the third component is 30°.

In FIG. 2, the values of normalized thickness h are plotted respectively for titanium (Ti), molybdenum (Mo), tungsten (W) and platinum (Pt) when the metal materials are used for the IDT electrodes 12 under the excitation condition. The relationship between the density of metal $\rho_M$ for the IDT electrodes 12 and the lower limit of a normalized thickness h necessary for the IDT electrodes 12 to excite the SH wave can be obtained from the values for the respective materials as the following equation (5):

$$y = 14.102 \times \exp(-0.075x) \quad (5),$$

where variables x and y correspond respectively to the horizontal axis and the vertical axis as shown in FIG. 2.

The embodiment described with respect to FIGS. 1A and 1B sets the lower limit to the normalized thickness h of the IDT electrodes 12 according to equation (4), i.e., 0.141×exp(−0.075$\rho_M$)≤h, so that the normalized thickness h can be ensured as the lower limit defined by equation (5) or greater. It is to be appreciated that the coefficient indicated in equation (5) is represented in percentage and accordingly is 100 times that of equation (4). Therefore, regardless of the density of the metal $\rho_M$ of the IDT electrodes 12, it is possible to excite an SH wave when the normalized thickness h is the lower limit or greater according to equation (4). For example, the lower limit of the normalized thickness h would be 1.5% in the IDT electrodes 12 made of molybdenum (Mo). It is to be appreciated that it is possible to further deposit an aluminum (Al) layer on the IDT electrodes 12 as long as the total thickness of the IDT electrodes 12 including the Al layer satisfies the aforementioned equation (4).

Angle φ of the first component of the Euler angles (φ, θ, ψ) for defining the cut angle according to the embodiment described above with respect to FIGS. 1A and 1B is defined by the following equation (6):

$$10° \leq \varphi \leq 50° \quad (6)$$

Equation (6) is obtained as follows.

Figure 3A:
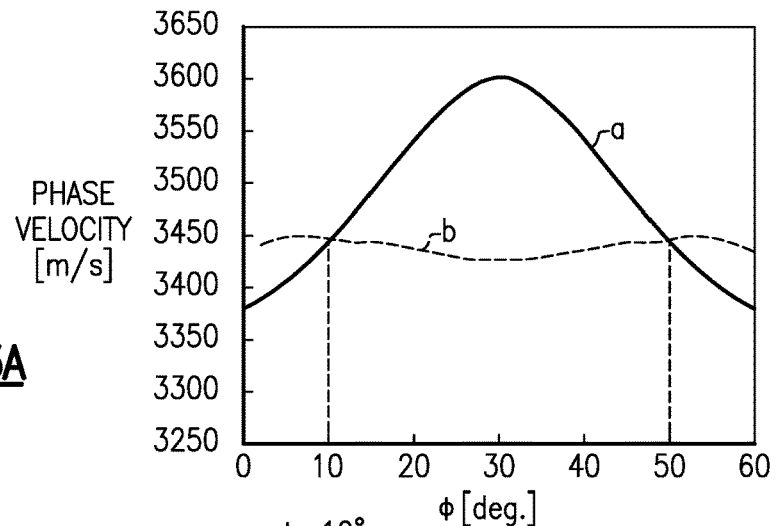
FIG. 3A is a graph showing relationships between a phase velocity and angle φ for a slow shear wave (SSW) and a shear horizontal (SH) wave.

FIG. 3A is a graph showing relationships between a phase velocity and angle φ for a SSW and a SH wave, where the thickness of the IDT electrodes 12 is set to the upper limit when titanium (Ti) is used for the material thereof. In FIG. 3A, the curve labelled "a" represents the phase velocity of an SSW whereas the curve labelled "b" represents that of an SH wave. It is to be appreciated that the phase velocity is referred to merely as the velocity hereinafter.

A non-leaky SH wave is excited when the velocity is less than that of the slow shear wave (SSW). The non-leaky SH wave is excited when the velocity of the SH wave is that of the SSW or less in a range where angle φ satisfies equation (6). In other words, equation (6) is obtained from the condition of the non-leaky SH wave to be excited.

Figure 3B:
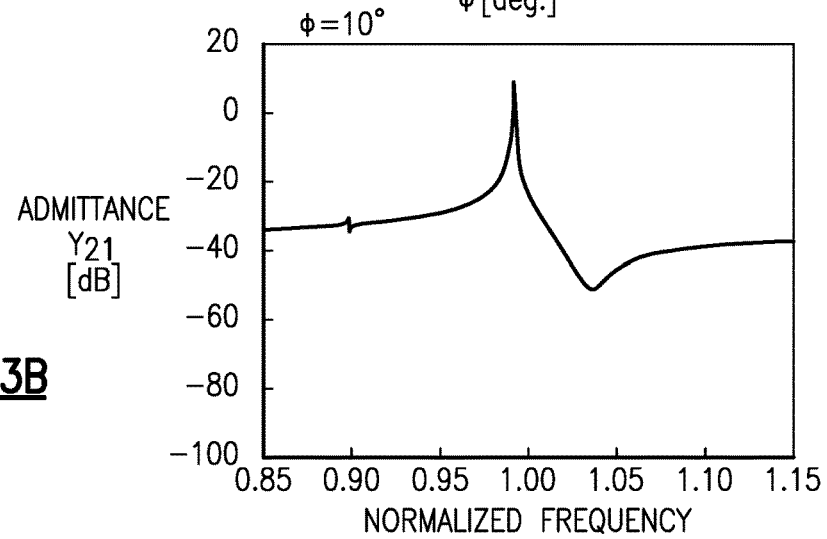
FIGS. 3B and 3C are graphs showing frequency characteristics of an acoustic wave element according to the embodiment of FIGS. 1A and 1B.
Figure 3C:
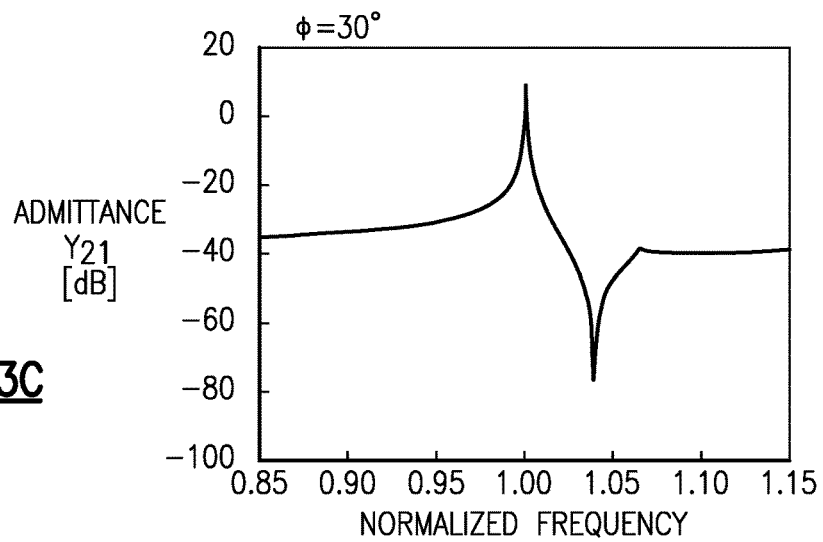

FIG. 3B shows a frequency characteristic when angle φ=10°, whereas FIG. 3C shows a frequency characteristic when angle φ=30°. The vertical axis in FIGS. 3B and C represents a forward admittance $Y_{21}$. When φ=10°, the antiresonant characteristic can be seen as degraded due to a leakage of an SH wave into a bulk wave. Further, a spurious Rayleigh wave signal can be seen near the resonant frequency.

On the other hand, when φ=30°, sharp resonant and antiresonant characteristics can be seen for the SH wave due to the excitation of a main mode SH wave. The spurious Rayleigh wave signal when φ=10° is suppressed and shifted to the lower frequency side out of the passband.

Angle θ of the second component of the Euler angles (φ, θ, ψ) according to the above-described embodiment of FIGS. 1A and 1B is defined by the following equation (7):

$$-90° - 0.5 \times (-0.2234\rho_M^2 + 6.9119\rho_M - 8.928)° \leq \theta \leq -90° + 0.5 \times (-0.2234\rho_M^2 + 6.9119\rho_M - 8.928)° \quad (7),$$

where $\rho_M$ is a density of metal for the material of the IDT electrodes 12.

Equation (7) is obtained as follows.

For example, when the material of the IDT electrodes 12 is tungsten (W), angle θ of the second component of the Euler angles is defined as the following equation (8):

$$-111° \leq \theta \leq -69° \quad (8)$$

Figure 4:
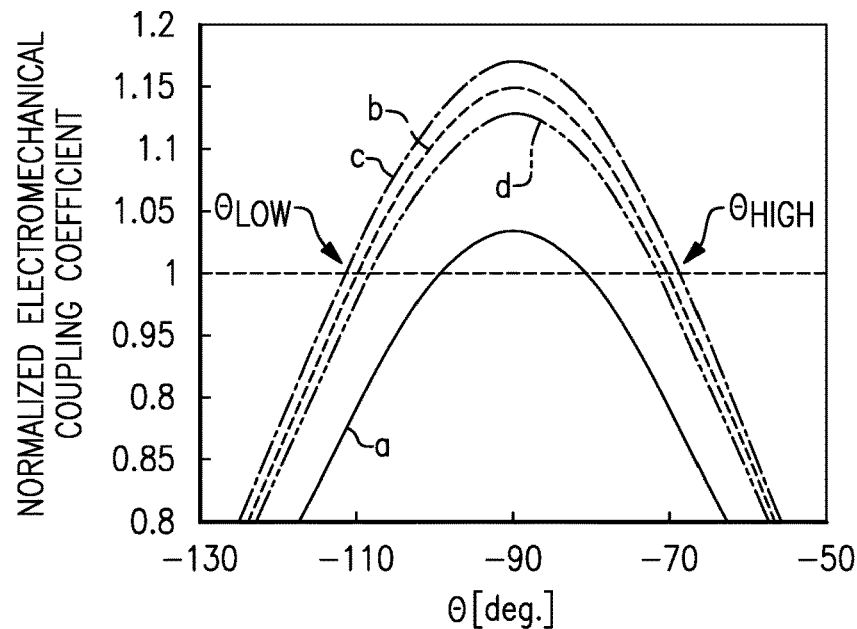
FIG. 4 shows a relationship between a normalized electromechanical coupling coefficient $k^2$ and angle θ.

FIG. 4 shows a relationship between a normalized electromechanical coupling coefficient $k^2$ and angle θ. The normalized electromechanical coupling coefficient $k^2$ is derived from the normalization by an electromechanical coupling coefficient for a conventional lithium tantalate substrate that is cut on 42° rotated Y axis and uses aluminum (Al) for the IDT electrodes.

In FIG. 4, the curves labelled "a," "b," "c ," and "d" follow polynomials corresponding respectively to titanium (Ti), molybdenum (Mo), tungsten (W) and platinum (Pt). In FIG. 4, the portion of each curve on which the electromechanical coupling coefficient is 1 or greater, i.e., the portion from the lower limit $\theta_{low}$ to the upper limit $\theta_{high}$, is a region for obtaining an electromechanical coupling coefficient that can be equal to or greater than what is achieved by the conventional lithium tantalate substrate. This region is defined by the following equation (9):

$$\theta_{low} \leq \theta \leq \theta_{high} \quad (9)$$

Figure 5:
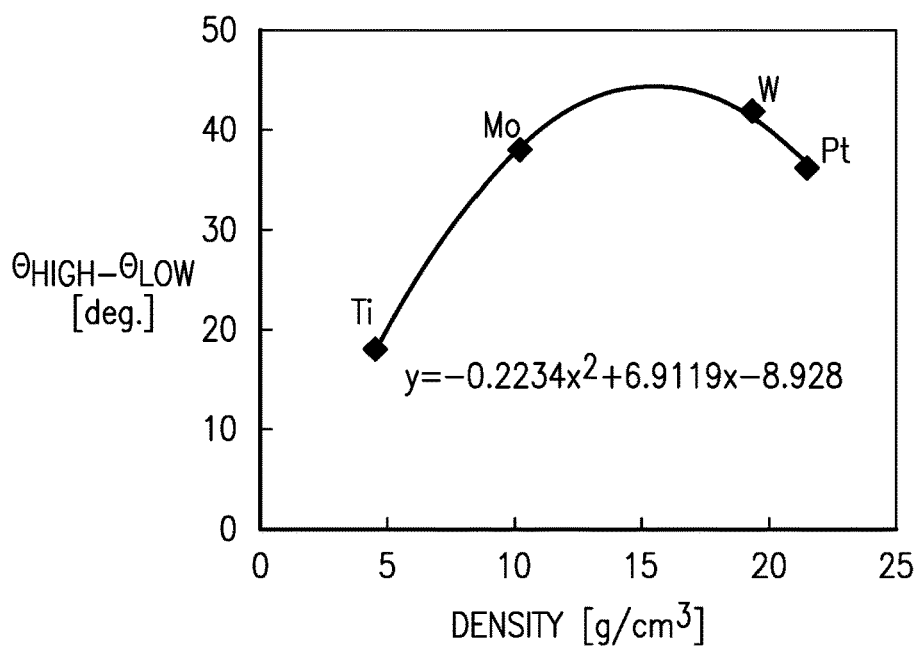
FIG. 5 is a graph showing a relationship between an angular difference $θ_{high} - θ_{low}$ and a density of an IDT electrode.

FIG. 5 is a graph an angular difference $\theta_{high} - \theta_{low}$ and a density of metal $\rho_M$ for the IDT electrodes 12. Specifically, angular differences $\theta_{high} - \theta_{low}$ are plotted in FIG. 5 for titanium (Ti), molybdenum (Mo), tungsten (W) and platinum (Pt) with respect to corresponding densities of metal $\rho_M$ for the IDT electrodes 12.

The relationship between the angular difference $\theta_{high}-\theta_{low}$ and the density of metal $\rho_M$ for the IDT electrodes 12 may exist along a curve according to the following equation (10) that is generally fitted to the values for the respective materials:

$$y=-0.2234x^2+6.9119x-8.928 \quad (10),$$

where the variables x and y correspond respectively to the horizontal axis and the vertical axis as shown in FIG. 5.

Aforementioned equation (7) is derived from the combination of equation (10) with equation (9) considering that the angular difference $\theta_{high}-\theta_{low}$ ranges symmetrically with respect to angle $\theta=-90°$. When angle $\theta$ is defined by equation (7), an electromechanical coupling coefficient is ensured to be equal to or greater than that of the conventional lithium tantalate substrate that is cut on 42° rotated Y axis and uses aluminum (Al) for the IDT electrodes.

Angle $\psi$ of the third component of the Euler angles ($\varphi$, $\theta$, $\psi$) according to the above-described embodiment of FIGS. 1A and 1B is defined by the following equation (11):

$$-16°\leq\psi\leq-2.5° \quad (11)$$

Equation (11) is obtained as follows.

Figure 6A:
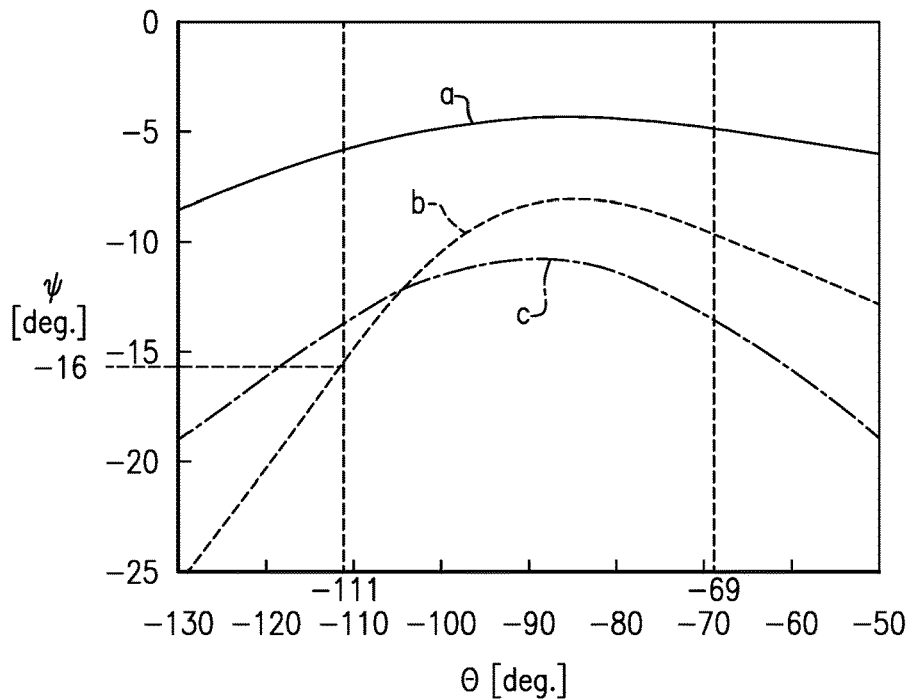
FIGS. 6A and 6B are graphs respectively showing dependencies of angle ψ on angle θ when resonant and antiresonant power flow angles are zero.
Figure 6B:
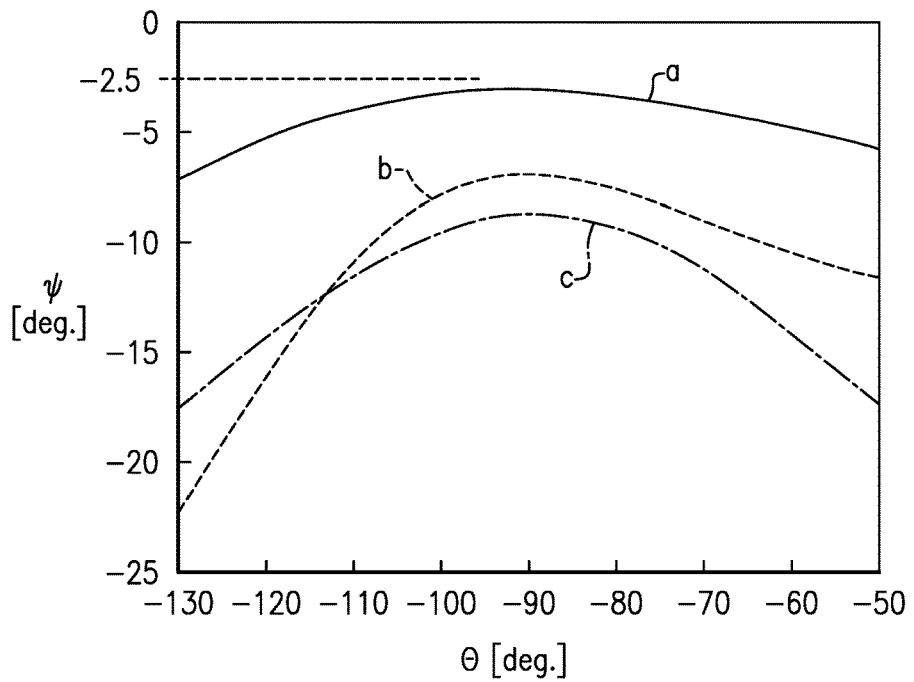

FIGS. 6A and 6B are graphs respectively showing dependencies of angle $\psi$ on angle $\theta$ when resonant and antiresonant power flow angles are zero for the IDT electrodes 12 made of tungsten (W).

FIG. 6A shows angle $\psi$ when a resonant power flow angle is zero. Angle $\varphi$ ranges according to aforementioned equation (6) so that angle $\varphi$ can range symmetrically with respect to angle $\varphi=30°$ as clearly shown in the curves labelled "a" and "b" of FIG. 3A. Accordingly, FIG. 6A shows angle $\psi$ when the resonant power flow angle is zero along curves a, b, and c corresponding respectively to angles $\varphi=10°$, 20° and 30°.

FIG. 6B shows angle $\psi$ when an antiresonant power flow angle is zero. Similar to FIG. 6A, FIG. 6B also shows angle $\psi$ when the antiresonant power flow angle is zero along curves a, b, and c corresponding respectively to angles $\varphi=10°$, 20° and 30°. When the IDT electrodes 12 are made of tungsten (W), the range of angle $\theta$ is defined according to aforementioned equation (8). In the range of angle $\theta$, as shown in FIGS. 6A and 6B, the range of angle $\psi$ where a resonant or antiresonant power flow angle can be zero includes the lower limit of angle $\psi=-16°$ when $\theta=111°$ in FIG. 6A and the upper limit of angle $\psi=-2.5°$ when $\theta=-90°$ in FIG. 6B. Accordingly, equation (11) is obtained.

Therefore, defining angle $\psi$ by equation (11) enables at least one of the resonant power flow angle and the antiresonant power flow angle to be zero when the IDT electrodes 12 are made of tungsten (W). This can reduce an energy loss originated from a power flow angle for the acoustic wave element 10. Here, the lower limit of the range of angle $\psi$ where a power flow angle is zero is represented by values of angle w at the lower limit of angle $\theta$ as shown in FIG. 6A. Therefore, considering that angle $\theta$ depends on a density of metal $\rho_M$ as shown in aforementioned equation (7), the lower limit of the range of angle w as shown in equation (11) would depend on a density of the IDT electrodes 12.

Figure 7A:
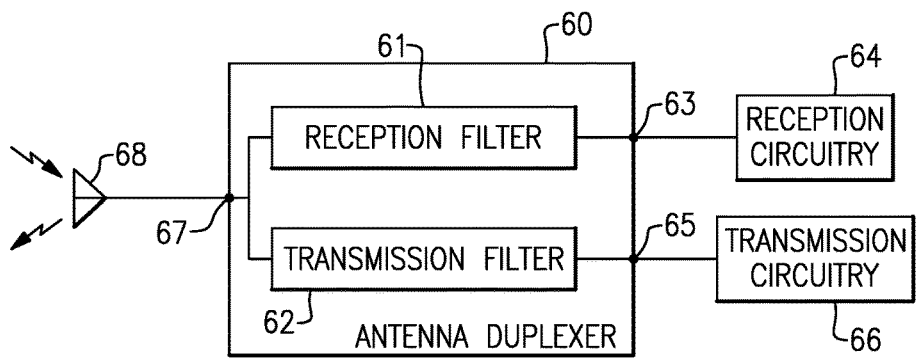
FIG. 7A is a block diagram schematically showing a configuration of an antenna duplexer that includes an acoustic wave element such as described with respect to FIGS. 1A and 1B.

FIG. 7A shows a configuration of an antenna duplexer that includes an acoustic wave element such as described above with respect to FIGS. 1A and 1B. The antenna duplexer 60 can be configured to include a reception filter 61 and a transmission filter 62, each of which can include an acoustic wave element 10 as described above so that a first frequency and a second frequency may pass respectively through the reception filter and the transmission filter. As shown in FIG. 7A, the duplexer 60 can include a common terminal 67 that can be used as an antenna terminal that can be coupled to an antenna 68, a first terminal 65 that can be used as a transmission terminal that can be coupled to transmission circuitry 66, and a second terminal 63 that can be used as a reception terminal that can be coupled to reception circuitry 64. The transmission circuitry 66 and the reception circuitry may be disposed in the same module, or in the same package as the antenna duplexer 60, or they may be disposed in a module or package that is external to the antenna duplexer 60.

Figure 7B:
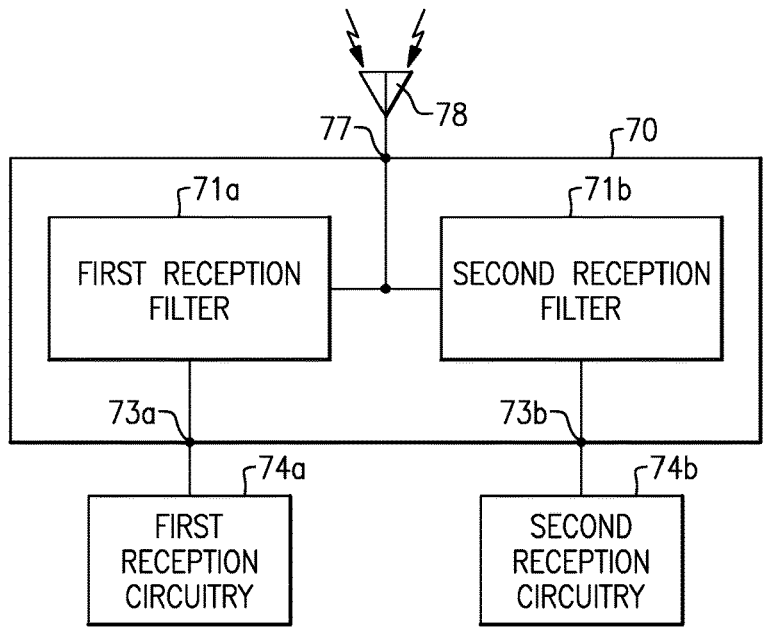
FIG. 7B is a block diagram schematically showing a configuration of a diplexer that includes an acoustic wave element such as described with respect to FIGS. 1A and 1B .

According to another embodiment, the acoustic wave element 10 may be incorporated into a filter device such as a diplexer that is used in separating reception signals having two frequency bands. An example of a diplexer 70 incorporating an example of an acoustic wave element 10 is shown schematically in FIG. 7B. In this example, the diplexer 70 can include a common terminal 77 that can be connected to an antenna 78 to receive signals having different frequencies. The diplexer 70 includes a first reception filter 71a and a second reception filter 71b, each of which is connected to the common terminal 77. In accordance with an aspect of the present disclosure, the acoustic wave element 10 described above can be used in the first reception filter 71a and/or the second reception filter 71b. The diplexer 70 further includes a first terminal 73a that can be used as a first reception terminal, and a second terminal 73b that can be used as a second reception terminal The first terminal 73a can be coupled to first reception circuitry 74a configured to receive a first frequency band, and the second terminal 73b can be coupled to second reception circuitry 74b configured to receive a second frequency band, different than the first frequency band.

Figure 8:
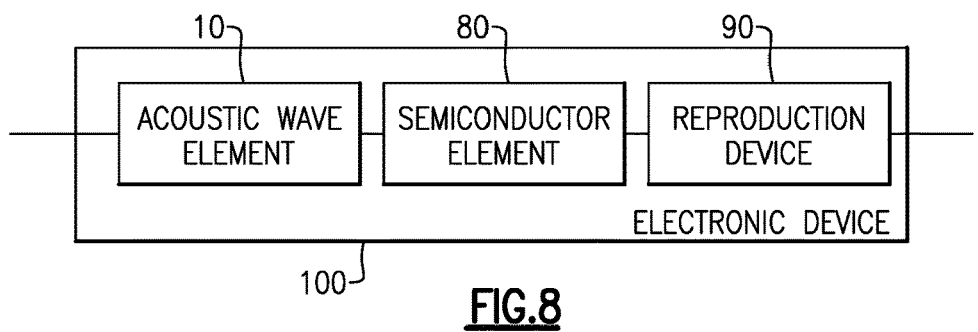
FIG. 8 is a block diagram schematically showing a configuration of an electronic device that includes an acoustic wave element such as described with respect to FIGS. 1A and 1B.

FIG. 8 shows a configuration of an electronic device that includes an acoustic wave element such as described above with respect to FIGS. 1A and 1B. As shown, the electronic device 100 includes an acoustic wave element 10 as described above with respect to FIGS. 1A and 1B, a semiconductor element 80 connected to the acoustic wave element 10, and a reproduction device 90 connected to the semiconductor element 80.

As discussed above, in accordance with the embodiment described above with respect to FIGS. 1A and 1B, it is possible to excite a non-leaky SH wave while minimizing the thickness $h_M$ of the IDT electrodes 12, the range of which is defined by aforementioned equation (2). Therefore, one can ensure the formation of the IDT electrodes 12 using conventional lithographic and other semiconductor processing techniques. Further, it is possible to suppress and shift out of the pass band a spurious Rayleigh wave signal because angle $\varphi$ is defined by aforementioned equation (6). Therefore, an improved filtering function can be achieved in the acoustic wave element 10, the reception filter 61 and/or the transmission filter 62 of the antenna duplexer 60, the first reception filter 71a or the second reception filter 71b of the diplexer 70, or the electronic device 100.

In accordance with a further aspect of the present disclosure, an acoustic wave element, an antenna duplexer, a diplexer, and an electronic device according to another embodiment is now described.

Figure 9A:
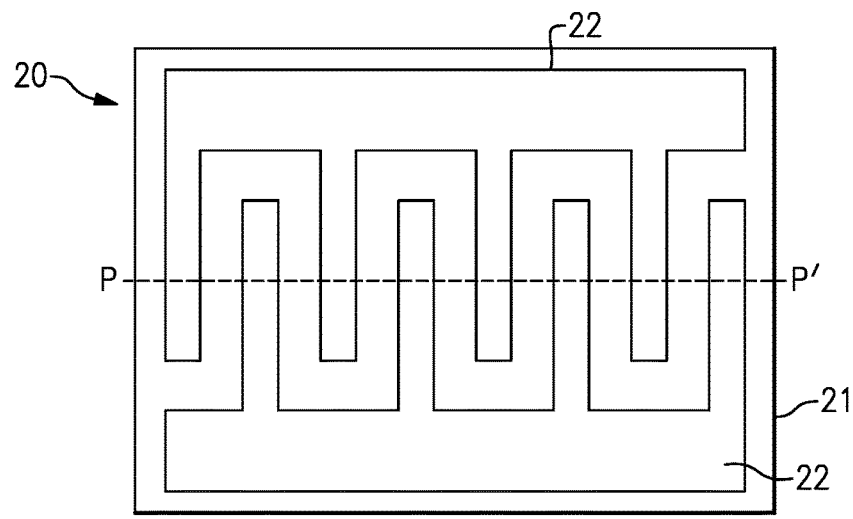
FIGS. 9A and 9B show a schematic structure of an acoustic wave element according to another embodiment of the present disclosure.
Figure 9B:
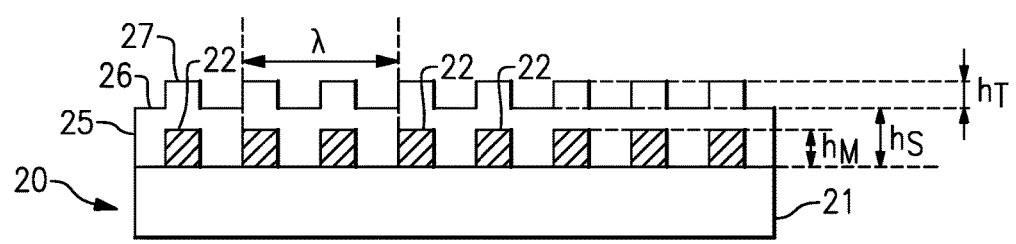

FIGS. 9A and 9B generally show a schematic structure of an acoustic wave element 20 according to another embodiment of the present disclosure. Specifically, FIG. 9A shows a top view of the acoustic wave element 20 and FIG. 9B shows a cross-sectional view of the acoustic wave element 20 taken along line PP' in FIG. 9A.

The acoustic wave element 20 is configured similarly to the acoustic wave element 10 described above with respect to FIGS. 1A and 1B in that a substrate 21 is fabricated by cutting a single crystal of lithium tantalate along a plane defined by the Euler angles (φ, θ, ψ), and IDT electrodes 22, each of which may excite an acoustic wave having a wavelength λ, are provided on a surface of the substrate 21. However, in contrast to the acoustic wave element 10 described above, the acoustic wave element 20 of embodiment 2 further includes a silicon dioxide (SiO₂) film 25 having a thickness $h_S$ that is formed on the surface of the substrate 21, on which the IDT electrodes 22 are formed. It is to be appreciated that because the silicon dioxide film 25 may be transparent, the silicon dioxide film 25 is not shown in the top view of FIG. 9A, whereas it is shown in the cross-sectional view of FIG. 9B.

The silicon dioxide film 25 has a thickness $h_S$ generally greater than a thickness $h_M$ of the IDT electrodes 22 from the surface of the substrate 21. Further, the silicon dioxide film 25 includes protrusions 27 formed on a surface 26 thereof. The protrusions 27 have a height $h_T$ and are disposed immediately above the electrode fingers of the IDT electrodes 22 having the thickness $h_S$. The protrusions 27 protrude above electrode fingers of the IDT electrode 22. As shown in FIG. 9B, the protrusions 27 appear in the cross-section in a direction perpendicular to the direction in which the electrode fingers of the IDT electrode 22 extend.

In accordance with an aspect of the present disclosure, the thickness $h_S$ of the silicon dioxide film 25 is defined by the following equation (12) using a wavelength λ of the IDT electrodes 22:

$$0.08\lambda \leq h_S \leq 0.55\lambda \tag{12}$$

Equation (12) is derived as follows.

Figure 10A:
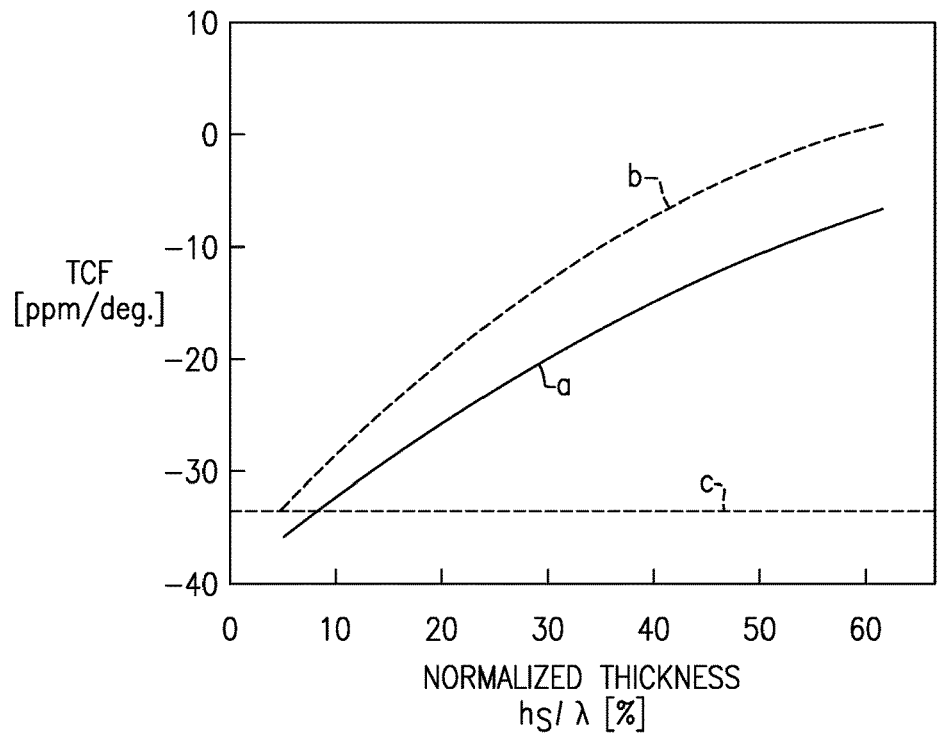
FIG. 10A is a graph showing a comparison result between an acoustic wave element according to the embodiment of FIGS. 9A and 9B and an acoustic wave element of the prior art in a relationship between a normalized thickness and a thermal coefficient of frequency of a silicon dioxide film.
Figure 10B:
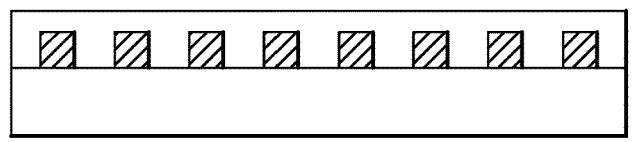
FIGS. 10B and 10C show schematic structures of acoustic wave elements according to two variations of the embodiment of FIGS. 9A and 9B.
Figure 10C:
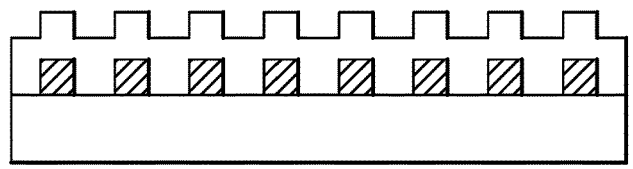

FIG. 10A is a graph showing a comparison result between an acoustic wave element according to the embodiment illustrated in FIGS. 9A and 9B and that of the prior art in a relationship between a normalized thickness $h_S/\lambda$, which is derived from the thickness $h_S$ of the silicon dioxide film 25 normalized by the wavelength λ, and a temperature coefficient of frequency (TCF). In FIG. 10A, the curve labelled "a" shows a TCF when the thickness $h_T$ of the protrusions 27 is configured to be zero as shown in FIG. 10B. The curve labelled "b" shows a TCF when the thickness $h_T$ of the protrusions 27 is configured to be the thickness $h_M$ of the IDT electrodes 22 as shown in FIG. 10C. The line labelled "c" shows a conventional typical value of TCF, i.e., −33 ppm/°C., when the IDT electrodes 22 are made of aluminum (Al).

As clearly shown in FIG. 10A, the TCF ranges from −33 ppm/°C. at 8% of $h_S/\lambda$ to 0 ppm/°C. at 55% of $h_S/\lambda$ so that the thickness $h_S$ of the silicon dioxide film 25 can be defined by equation (12). Therefore, according to equation (12), a temperature characteristic of frequency better than that of the prior art can be realized.

In accordance with this embodiment, a height $h_T$ of a protrusion 27 of the silicon dioxide film 25 is defined by following equation (13) using the thickness $h_M$ of the IDT electrode 22:

$$0 \leq h_T \leq h_M \tag{13}$$

When the surface 26 of the silicon dioxide film 25 is configured to be flat, the thickness $h_T$ of a protrusion 27 is minimized to be zero. Further, the height $h_T$ of a protrusion 27 is maximized to the thickness $h_M$ of the IDT electrode 22.

Therefore, the height $h_T$ of a protrusion 27 of the silicon dioxide film 25 is limited to the range defined by equation (13).

According to the embodiment described with respect to FIGS. 9A and 9B, angle ψ of the third component of the Euler angles is defined by the following equation (14):

$$(-371.81 h_S^2 + 36.92 h_S + 3.53)° \leq \psi \leq (-371.81 h_S^2 + 36.92 h_S + 13.53)° \tag{14}$$

Equation (14) is obtained as follows.

Figure 11:
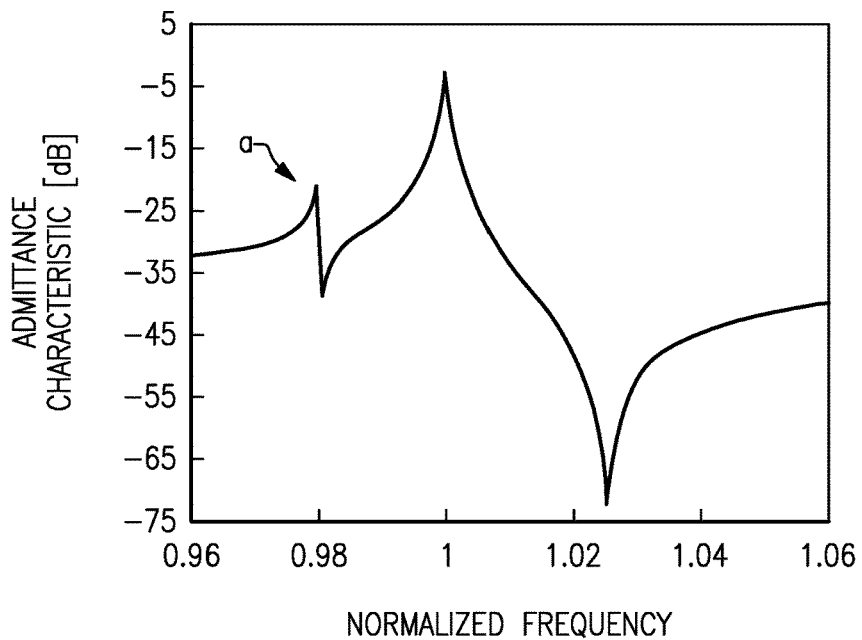
FIG. 11 is a graph showing a frequency characteristic of an acoustic wave element according to the embodiment of FIGS. 9A and 9B.
Figure 12:
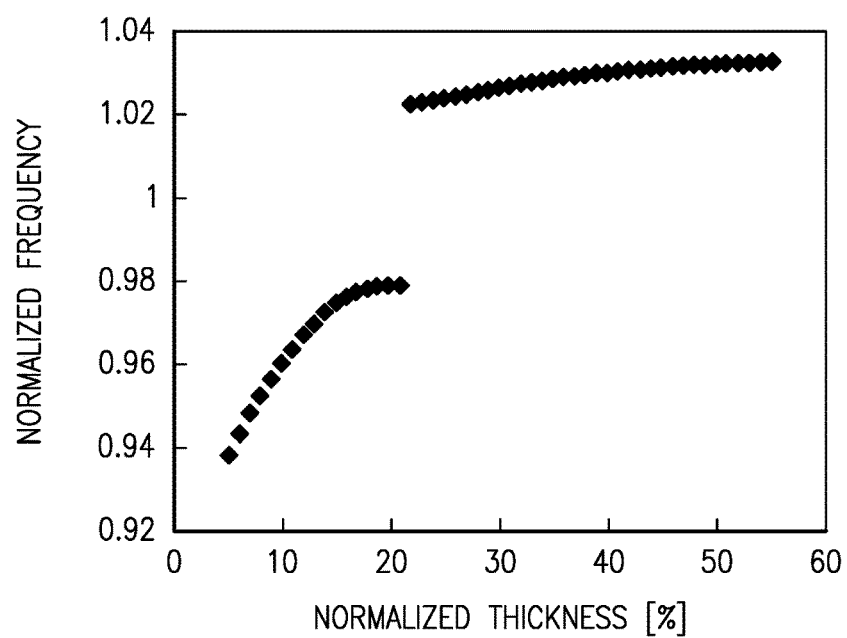
FIG. 12 is a graph showing a relationship between a spurious Rayleigh wave signal frequency and a thickness of a silicon dioxide film.

FIG. 11 is a graph showing a frequency characteristic of an acoustic wave element 20 according to the embodiment described with respect to FIGS. 9A and 9B. FIG. 12 is a graph showing a relationship between a spurious Rayleigh wave signal frequency and a thickness of a silicon dioxide film 25. As shown in FIG. 12, a normalized frequency of a spurious Rayleigh wave signal becomes greater as the thickness $h_S$ of the silicon dioxide film 25 becomes greater. Accordingly, it can be seen from FIGS. 11 and 12 that a spurious Rayleigh wave signal designated by the letter "a" in FIG. 11 approaches the resonant frequency and the antiresonant frequency of a main mode SH wave as the thickness $h_S$ of the silicon dioxide film 25 becomes greater.

Figure 13A:
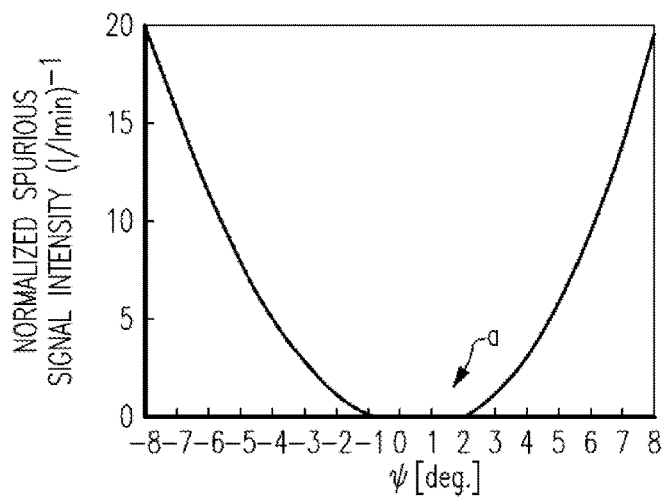
FIG. 13A is a graph showing a relationship between angle ψ and an intensity of a spurious Rayleigh wave signal and FIG. 13B is a graph showing a frequency characteristic of an acoustic wave element according to the embodiment of FIGS. 9A and 9B.
Figure 13B:
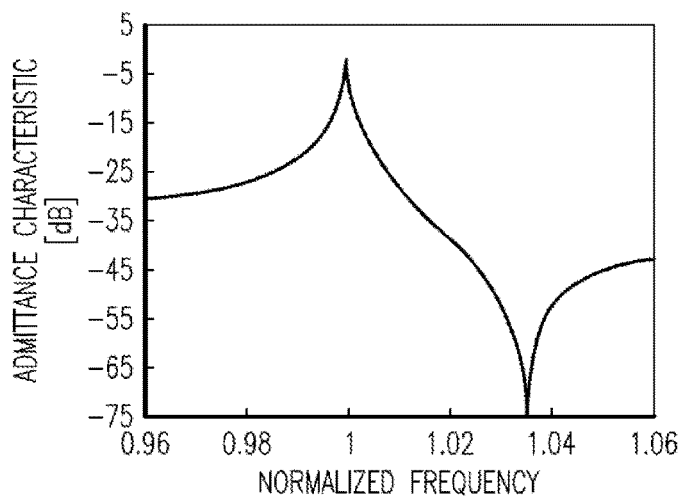

FIG. 13A is a graph showing a relationship between angle ψ and an intensity of a spurious Rayleigh wave signal and FIG. 13B is a graph showing a frequency characteristic of an acoustic wave element 20 according to the embodiment of FIGS. 9A and 9B. As shown in FIG. 13A, a normalized spurious signal intensity $(I/I_{min})^{-1}$ may be suppressed to zero or close to zero within a specific range of angle ψ as designated by the letter "a." Within the specific range as shown in FIG. 13A, there is no spurious Rayleigh wave signal near the resonant and antiresonant frequencies as shown in the frequency characteristic of FIG. 13B, where the vertical axis designates an admittance characteristic based on the resonance frequency.

Figure 14:
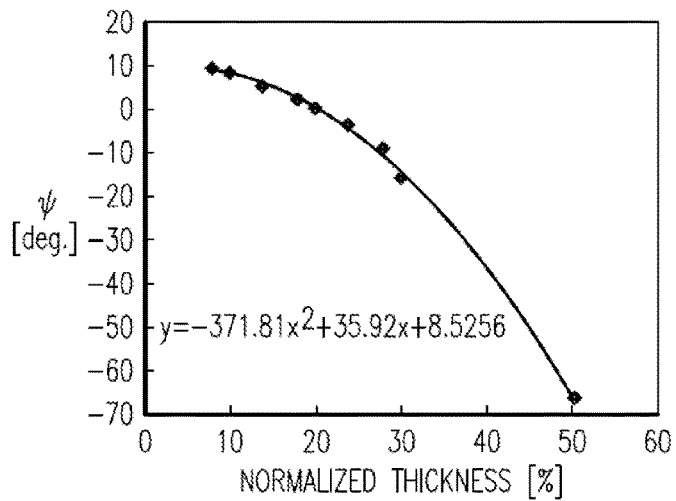
FIG. 14 is a graph showing a relationship between a thickness of a silicon dioxide film and a central value for a specific range of angle ψ at which a spurious Rayleigh wave signal is suppressed.

FIG. 14 is a graph showing a relationship between a thickness $h_S$ of the silicon dioxide film 25 and a central value for a specific range of angle ψ within which a spurious Rayleigh wave signal is suppressed. The specific range corresponds to a specific range as designated by the letter "a" in FIG. 13A where the normalized spurious signal intensity may be suppressed to zero or close to zero. Some central values for a thickness $h_S$ of the silicon dioxide film 25 falling within the specific range are plotted in FIG. 14. The following equation (15) can be obtained from the values to represent the relationship between a thickness $h_S$ of the silicon dioxide film 25 and a central value within the specific range:

$$\psi = -371.81 x^2 + 36.92 x + 3.5256 \tag{15},$$

where the variables x and y correspond respectively to the horizontal axis and the vertical axis as shown in FIG. 14.

Setting a certain width to central values within the specific range defined by equation (15) may define a specific angular range for angle ψ. For example, if the certain width is set as ±5°, then the angular range for angle ψ can be obtained as defined by aforementioned equation (14). It should be appreciated that the width is not limited to ±5° and can be appropriately determined based on a specific range, such as a range designated by the letter "a" in FIG. 13A. Therefore, according to equation (14), suppressing a spurious Rayleigh wave signal near resonant and antiresonant frequencies can be realized so that the frequency characteristic is improved.

It should be appreciated that an antenna duplexer, a diplexer, and/or an electronic device can be configured using the acoustic wave element 20 described above with respect to the embodiment of FIGS. 9A and 9B in the same manner as discussed above with respect to the acoustic wave element 10 of FIGS. 1A and 1B. The antenna duplexer, the diplexer, and the electronic device are similar to those described above with respect to FIGS. 7A, 7B, and 8 except for the use of acoustic wave element 20 instead of the acoustic wave element 10. Further, although the silicon dioxide film 25 is formed on the substrate 21 and the IDT electrode 22 as shown in FIGS. 9A and 9B, it may be possible to form an insulation layer using another suitable material instead of silicon dioxide. Suitable materials for such an insulation lay may be selected from those having a temperature coefficient of frequency that is opposite to that of the lithium tantalate substrate.

Figure 15A:
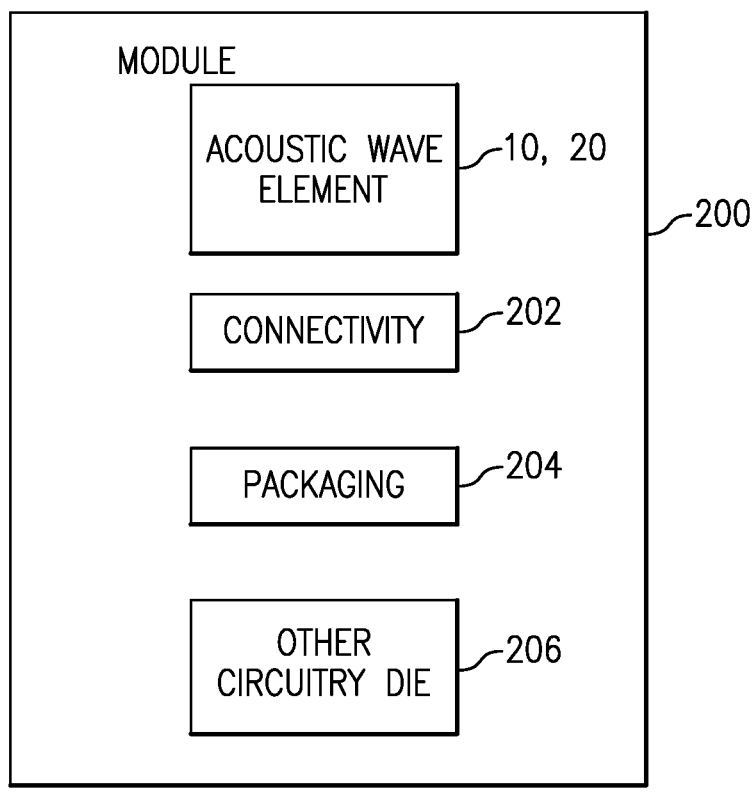
FIG. 15A is a block diagram of one example of a module including an embodiment of the acoustic wave element according to aspects of the present disclosure.
Figure 15B:
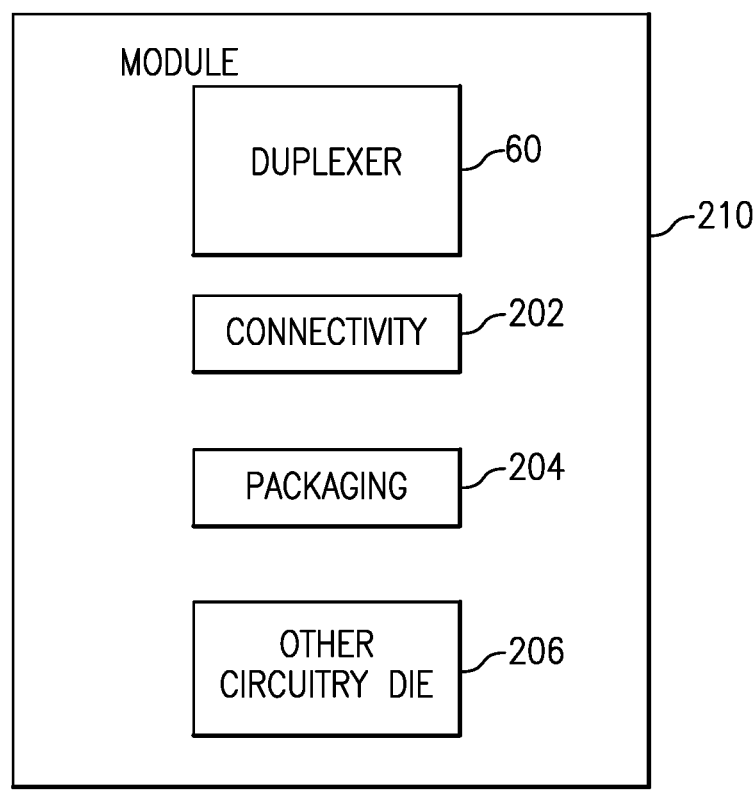
FIG. 15B is a block diagram of one example of a module including an embodiment of a duplexer according to aspects of the present disclosure.
Figure 15C:
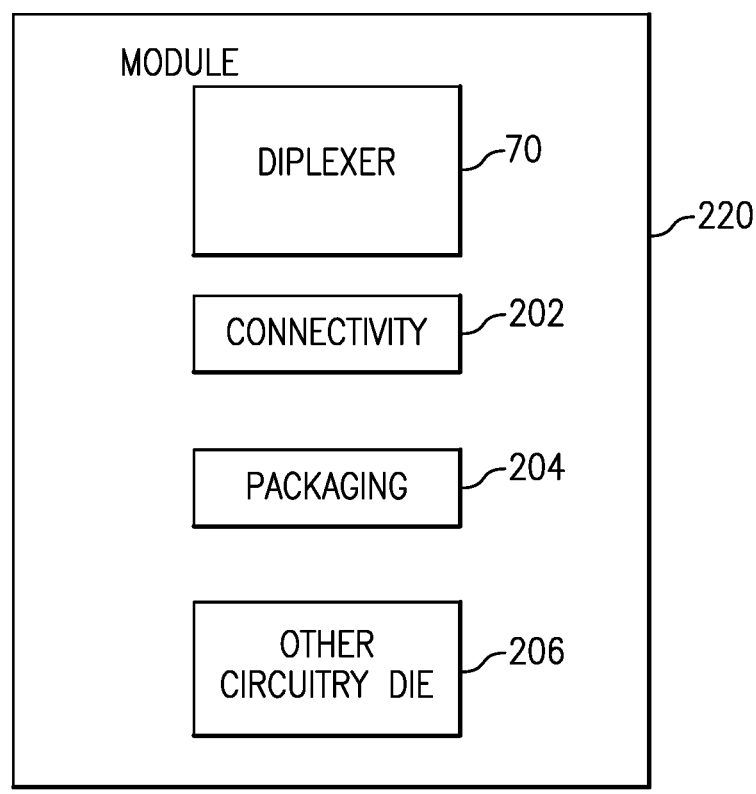
FIG. 15C is a block diagram of one example of a module including an embodiment of a diplexer according to aspects of the present disclosure.

It should be appreciated that embodiments of the present disclosure can be applied to a mobile communication device and the like. For example, embodiments of the acoustic wave element 10 or 20, a duplexer 60 or a diplexer 70 including the acoustic wave element 10, 20 may be incorporated into and packaged as a module that may ultimately be used in an electronic device 100, such as a wireless communications device, for example. FIG. 15A is a block diagram illustrating one example of a module 200 including the acoustic wave element 10, 20. The module 200 further includes connectivity 202 to provide signal interconnections, packaging 204, such as for example, a package substrate, for packaging of the circuitry, and other circuitry die 206, such as, for example amplifiers, pre-filters, modulators, demodulators, down converters, and the like, as would be known to one of skill in the art of semiconductor fabrication in view of the disclosure herein. FIGS. 15B and 15C are block diagrams illustrating other examples of a module 210, 220 including an embodiment of the duplexer 60 or diplexer 70, respectively, either of which may incorporate an embodiment of the acoustic wave element 10, 20, as discussed above with reference to FIGS. 7A and 7B.

The acoustic wave element 10, 20, duplexer 60, diplexer 70, or any of the modules 200, 210, 220, according to examples and embodiments disclosed herein may be useful in a variety of electronic devices, such as communications or wireless devices (e.g., cell phones, tablets, etc.).

Figure 16:
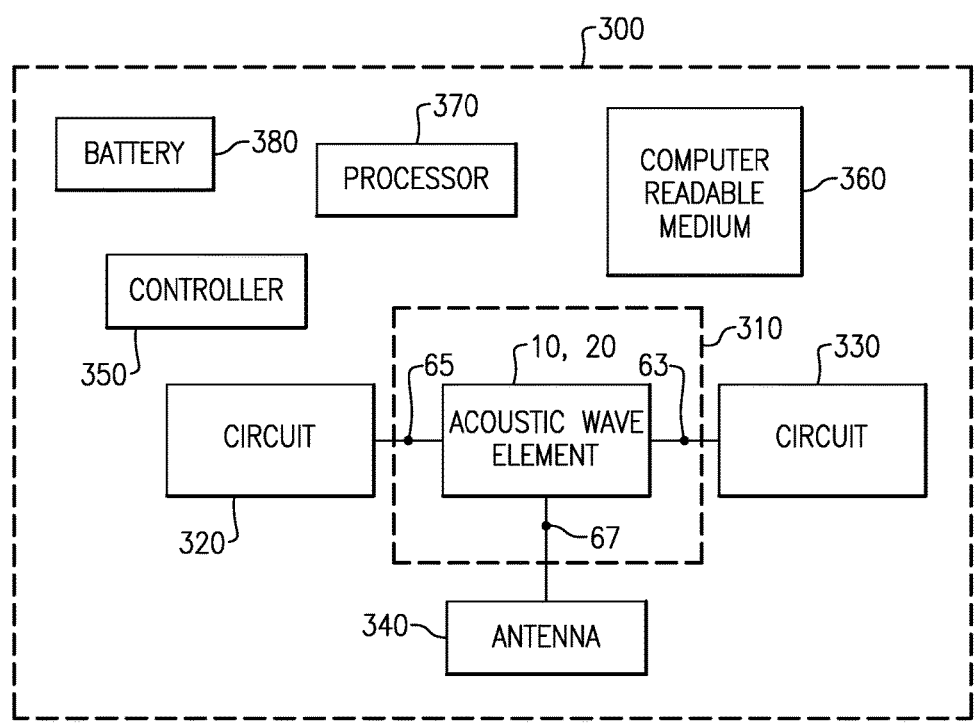
FIG. 16 is a block diagram of one example of an electronic device including an embodiment of the acoustic wave element according to aspects of the present disclosure.

FIG. 16 is a block diagram illustrating an example of an electronic device 300 that can include acoustic wave elements 10, 20 having one or more features discussed herein. For instance, the example electronic device 300 can include an acoustic wave element 10, 20, duplexer 60, or diplexer 70 in accordance with any of the principles and advantages discussed above with reference to any of FIGS. 1A-14. The example electronic device 300 can be a mobile phone, such as a smart phone. The electronic device 300 can include elements that are not illustrated in FIG. 16 and/or a subcombination of the illustrated elements. The electronic device 300 depicted in FIG. 16 can represent a multi-band and/or multi-mode device such as a multi-band/multi-mode mobile phone. By way of example, the electronic device 300 can be a wireless device that communicates in accordance with Long Term Evolution (LTE). In this example, the electronic device 300 can be configured to operate at one or more frequency bands defined by an LTE standard. The electronic device 300 can alternatively or additionally be configured to communicate in accordance with one or more other communication standards, including but not limited to one or more of a Wi-Fi standard, a Bluetooth standard, a 3G standard, a 4G standard or an Advanced LTE standard.

In certain embodiments, the electronic device 300 can include a filtering module 310 that includes one or more embodiments of the acoustic wave element 10, 20 and which is connected to circuits 320 and 330 via terminals 65 and 63, respectively. The electronic device can further include an antenna 340 connected to the filtering module 310 via common terminal 67. The filtering module 310 can include any of the modules 200, 210, or 220 discussed above with reference to FIGS. 15A-C. The circuits 320 and 330 can be reception or transmission circuits that can generate RF signals for transmission via the antenna 340 or receive incoming signals from the antenna 340.

Figure 17:
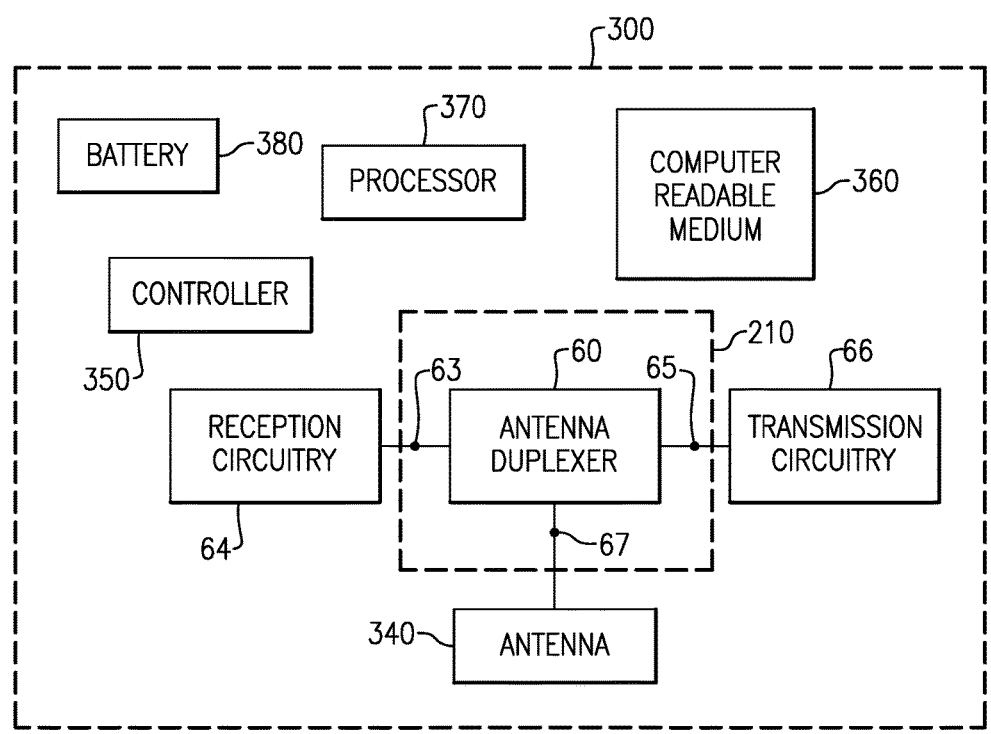
FIG. 17 is a block diagram of another example of an electronic device including an embodiment of the antenna duplexer of FIG. 7A according to aspects of the present disclosure.

Referring to FIG. 17, in one particular example, the filtering module 310 of FIG. 16 includes the antenna duplexer module 210. In this example, the electronic device 300 can include the antenna duplexer 60, the transmission circuitry 66 connected to the antenna duplexer via input terminal 65, the reception circuitry 64 connected to the antenna duplexer via output terminal 63, and the antenna 340 connected to the antenna duplexer via antenna terminal 67. The transmission circuitry 66 and reception circuitry 64 may be part of a transceiver that can generate RF signals for transmission via the antenna 340 and can receive incoming RF signals from the antenna 340.

As shown in FIGS. 16 and 17, the communication device 300 can further include a controller 350, at least one computer readable medium 360, at least one processor 370, and a battery 380.

It will be understood that various functionalities associated with the transmission and receiving of RF signals can be achieved by one or more components that are represented in FIG. 17 as the transmission circuitry 66 and the reception circuitry 64. For example, a single component can be configured to provide both transmitting and receiving functionalities. In another example, transmitting and receiving functionalities can be provided by separate components Similarly, it will be understood that various antenna functionalities associated with the transmission and receiving of RF signals can be achieved by one or more components that are collectively represented in FIGS. 16 and 17 as the antenna 340. For example, a single antenna can be configured to provide both transmitting and receiving functionalities. In another example, transmitting and receiving functionalities can be provided by separate antennas. In yet another example in which the communication device is a multi-band device, different bands associated with the communication device 300 can be provided with different antennas.

To facilitate switching between receive and transmit paths, the antenna duplexer 60 can be configured to electrically connect the antenna 340 to a selected transmit or receive path. Thus, the antenna duplexer 60 can provide a number of switching functionalities associated with an operation of the communication device 300. In addition, as discussed above, the antenna duplexer 60 includes the transmission filter 62 and reception filter 61 (see FIG. 7A) which are configured to provide filtering of the RF signals.

As shown in FIGS. 16 and 17, in certain embodiments, a controller 350 can be provided for controlling various functionalities associated with operations of the filtering module 310 (e.g., the antenna duplexer module 210) and/or other operating component(s). In certain embodiments, the at least one processor 370 can be configured to facilitate implementation of various processes for operation of the communication device 300. The processes performed by the at least one processor 370 may be implemented by computer program instructions. These computer program instructions may be provided to the at least one processor 370, which can be a general purpose computer, a special purpose computer, or another programmable data processing apparatus to produce a machine, such that the instructions, which execute via the at least one processor of the computer or other programmable data processing apparatus, create a mechanism for operating the communication device 300. In certain embodiments, these computer program instructions may also be stored in the computer-readable medium 360. The battery 380 can be any suitable battery for use in the communication device 300, including, for example, a lithium-ion battery.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An acoustic wave element comprising:
   a lithium tantalate substrate having Euler angles ($\varphi$, $\theta$, $\psi$), a first component $\varphi$ satisfying $10° \leq \varphi \leq 50°$ and a second component $\theta$ satisfying $-90°-0.5\times(-0.2234\rho_M^2+6.9119\rho_M-8.928)° \leq \theta \leq -90°+0.5\times(-0.2234\rho_M^2+6.9119\rho_M-8.928)°$; and
   an electrode disposed on the lithium tantalate substrate and configured to excite a main acoustic wave of wavelength $\lambda$, where $\rho_M$ represents a density of the electrode, the electrode density $\rho_M$ satisfying $\rho_M \geq \rho_{Ti}$, where $\rho_{Ti}$ represents a density of titanium (Ti), and a thickness $h_M$ of the electrode satisfies $0.141 \times \exp(-0.075\rho_M)\lambda \leq h_M \leq 0.134\lambda$.

2. The acoustic wave element of claim 1 further comprising an insulation layer having a temperature coefficient opposite to that of the lithium tantalate substrate, the insulation layer covering the lithium tantalate substrate and the electrode.

3. The acoustic wave element of claim 2 wherein the insulation layer is made of silicon dioxide.

4. The acoustic wave element of claim 3 wherein the insulation layer has a thickness $h_S$ satisfying $0.08\lambda \leq h_S \leq 0.55\lambda$.

5. The acoustic wave element of claim 2 wherein the insulation layer includes a protrusion disposed above the electrode in a cross section taken along a direction perpendicular to an extending direction of electrode fingers of the electrode.

6. The acoustic wave element of claim 5 wherein a height $h_T$ of the protrusion and a thickness $h_M$ of the electrode satisfies $0 \leq h_T \leq h_M$.

7. The acoustic wave element of claim 2 wherein a third component $\psi$ satisfies $(-371.81h_S^2+36.92h_S+3.53)° \leq \psi \leq (-371.81h_S^2+36.92h_S+13.53)°$.

8. An antenna duplexer comprising:
   a reception filter configured to pass a first frequency; and
   a transmission filter configured to pass a second frequency, at least one of the reception and the transmission filters including the acoustic wave element of claim 1.

9. A diplexer comprising:
   a first reception filter configured to receive a first frequency band; and
   a second reception filter configured to receive a second frequency band different than the first frequency band, at least one of the first reception filter and the second reception filter including the acoustic wave element of claim 1.

10. A communications device comprising one of the antenna duplexer of claim 8 and the diplexer of claim 9.

11. The communications device of claim 10 wherein the communications device is a mobile phone.

12. The acoustic wave element of claim 1 wherein the electrode is an Interdigitated Transducer (IDT) electrode having interdigitated electrode fingers.

13. The acoustic wave element of claim 12 wherein the IDT electrode includes one metal selected from a group consisting of titanium, molybdenum, tungsten and platinum.

14. The acoustic wave element of claim 13 wherein an aluminum layer is deposited on the IDT electrode.

15. The acoustic wave element of claim 14 wherein a thickness $h_M$ of the IDT electrode includes a thickness of the IDT electrode and a thickness of the aluminum layer.

16. The acoustic wave element of claim 13 wherein the second component $\theta$ satisfies $-111° \leq \theta \leq -69°$.

17. The acoustic wave element of claim 16 wherein the IDT electrode includes tungsten.

18. The acoustic wave element of claim 1 wherein a third component $\psi$ satisfies $-16° \leq \psi \leq -2.5°$.

19. An acoustic wave element comprising:
   a lithium tantalite substrate having Euler angles ($\varphi\theta\psi$), a first component $\varphi$ satisfying $10° \leq \varphi \leq 50°$ and a third component $\psi$ satisfying $-16° \leq \psi \leq -2.5°$; and
   an electrode disposed on the lithium tantalate substrate and configured to excite a main acoustic wave of wavelength $\lambda$, the electrode having a density $\rho_M$ satisfying $\rho_M \leq \rho_{Ti}$, where $\rho_{Ti}$ represents a density of titanium (Ti), and a thickness $h_M$ of the electrode satisfies $0.141 \times \exp(-0.075\rho_M)\lambda \leq h_M \leq 0.134 \lambda$.

20. The acoustic wave element of claim 19 further comprising an insulation layer having a temperature coefficient opposite to that of the lithium tantalate substrate, the insulation layer covering the lithium tantalate substrate and the electrode.

* * * * *